(12) United States Patent
Sato

(10) Patent No.: US 11,536,613 B2
(45) Date of Patent: Dec. 27, 2022

(54) TEMPERATURE SENSING CIRCUIT AND SENSING METHOD THEREOF

(71) Applicant: Winbond Electronics Corp., Taichung (TW)

(72) Inventor: Takahiko Sato, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 384 days.

(21) Appl. No.: 16/836,914

(22) Filed: Apr. 1, 2020

(65) Prior Publication Data
US 2021/0310875 A1 Oct. 7, 2021

(51) Int. Cl.
*G01K 7/00* (2006.01)
*G11C 11/406* (2006.01)
*G01K 3/08* (2006.01)

(52) U.S. Cl.
CPC .............. *G01K 7/00* (2013.01); *G01K 3/08* (2013.01); *G11C 11/406* (2013.01)

(58) Field of Classification Search
CPC ... G01K 3/08; G01K 7/00; G01K 7/32; G11C 11/406; G11C 11/40626; G11C 7/04; G11C 7/222
USPC ......................................................... 702/130
See application file for complete search history.

(56) References Cited

U.S. PATENT DOCUMENTS

| 5,278,796 | A | 1/1994 | Tillinghast et al. |
| 7,654,736 | B1 * | 2/2010 | Walker ................ G01K 7/425 |
| | | | 374/176 |

FOREIGN PATENT DOCUMENTS

| CN | 103021451 | 3/2016 |
| TW | 200620287 | 6/2006 |

* cited by examiner

*Primary Examiner* — John H Le
(74) *Attorney, Agent, or Firm* — JCIPRNET

(57) ABSTRACT

A temperature sensing circuit adapted for a memory device and including an oscillator, a count circuit, a control circuit, a sense circuit and a select circuit is provided. The oscillator provides an oscillation signal. The count circuit counts the oscillation signal to generate a first count signal, and generates a second count signal. The count circuit performs a logic operation on the second count signal to generate an enable signal and a sensing adjustment signal. The sense circuit generates a reference temperature voltage by dividing a reference voltage according to the sensing adjustment signal, and compares the reference temperature voltage and a monitor voltage according to the enable signal to generate a determination signal. The select circuit dynamically selects one of the oscillation signal and the first count signal according to the determination signal, and generates a pulse of a refresh request signal according to the dynamically selected one of the oscillation signal and the first count signal.

20 Claims, 15 Drawing Sheets

| CNT_N | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| bit3A | 0 | 0 | 0 | 0 | 0 | 0 | 0 | 0 | 1 | 1 | 1 | 1 | 1 | 1 | 1 | 1 |
| bit2A | 0 | 0 | 0 | 0 | 1 | 1 | 1 | 1 | 0 | 0 | 0 | 0 | 1 | 1 | 1 | 1 |
| bit1A | 0 | 0 | 1 | 1 | 0 | 0 | 1 | 1 | 0 | 0 | 1 | 1 | 0 | 0 | 1 | 1 |
| bit0A | 0 | 1 | 0 | 1 | 0 | 1 | 0 | 1 | 0 | 1 | 0 | 1 | 0 | 1 | 0 | 1 |

| ST | 0 | 1 | 2 | 3 | 4 | 5 | 6 | | | | | | | | | |
|---|---|---|---|---|---|---|---|---|---|---|---|---|---|---|---|---|
| bit2B | 0 | 0 | 0 | 0 | 0 | 1 | 1 | 0 | 0 | 0 | 0 | 0 | 0 | 0 | 0 | 0 |
| bit1B | 0 | 0 | 1 | 1 | 0 | 0 | 1 | 0 | 0 | 0 | 1 | 1 | 0 | 1 | 1 | 0 |
| bit0B | 0 | 1 | 0 | 1 | 0 | 1 | 0 | 1 | 0 | 1 | 0 | 1 | 1 | 1 | 1 | 1 | bit2B to 0
bit1B to 0
bit0B to 0

FIG. 4

| Temperature °C | Refreshed pulse count [1] | Refreshed pulse count [16] | Refreshed pulse sum SUM | Average refreshed pulse number | Average refresh interval |
|---|---|---|---|---|---|
| 0 | 16 | 0 | 16 | 1.00 | 16.00 |
| 15 | 16 | 0 | 16 | 1.00 | 16.00 |
| 25 | 15 | 1 | 31 | 1.94 | 8.26 |
| 35 | 14 | 2 | 46 | 2.88 | 5.57 |
| 45 | 13 | 3 | 61 | 3.81 | 4.20 |
| 55 | 11 | 5 | 91 | 5.69 | 2.81 |
| 65 | 9 | 7 | 121 | 7.56 | 2.12 |
| 75 | 6 | 10 | 166 | 10.38 | 1.54 |
| 85 | 0 | 16 | 256 | 16.00 | 1.00 |
| 100 | 0 | 16 | 256 | 16.00 | 1.00 |

FIG. 6A

| Temperature °C | Refreshed pulse count [16] | Refreshed pulse count [1] | Average refresh interval |
|---|---|---|---|
| 0 | 16 | 0 | 16.00 |
| 15 | 16 | 0 | 17.07 |
| 25 | 10 | 6 | 10.38 |
| 35 | 7 | 9 | 7.56 |
| 45 | 5 | 11 | 5.69 |
| 55 | 3 | 13 | 3.81 |
| 65 | 2 | 14 | 2.88 |
| 75 | 1 | 15 | 1.94 |
| 85 | 0 | 16 | 1.00 |
| 100 | 0 | 16 | 1.00 |

FIG. 10A

| Temperature °C | Refreshed pulse count [16] | Refreshed pulse count [1] | Average refresh interval |
|---|---|---|---|
| 0 | 8 | 0 | 16.00 |
| 20 | 8 | 0 | 16.00 |
| 30 | 6 | 2 | 12.25 |
| 35 | 5 | 3 | 10.38 |
| 40 | 4 | 4 | 8.50 |
| 45 | 3 | 5 | 6.63 |
| 50 | 2 | 6 | 4.75 |
| 65 | 1 | 7 | 2.88 |
| 100 | 0 | 8 | 1.00 |

FIG. 11A

TEMPERATURE SENSING CIRCUIT AND SENSING METHOD THEREOF

TECHNICAL FIELD

The invention relates to a memory device, and more particularly, to a temperature sensing circuit for providing a refresh request signal and a sensing method thereof.

BACKGROUND

Dynamic random access memory (Dynamic RAM, DRAM) includes a plurality of memory cells. The memory cells are used to store bits of data, and each bit is determined according to a level of potential accumulated on a capacitor of the memory cell. Because charges accumulated on the capacitor will gradually discharge, it is difficult to determine the potential after a period of time. The period of time from when the charge on the capacitor begins to discharge until a logic potential ("0" or "1") of the data cannot be accurately determined is called a refresh time. A refresh request signal needs to be provided at a refresh interval shorter than the refresh time in order to refresh the memory cells and hold the data. The refresh interval refers to a time interval between two refresh request signals.

In DRAM, the memory cell has a different retention time for a different temperature, and applies a different refresh interval. For instance, when dropping from 55° C. to 20° C., the DRAM memory cell has the retention time increased by approximately 4 times, and applies a 4 times refresh interval. Therefore, in the conventional technology, multiple temperature thresholds are used to divide an operating temperature into a plurality of sections, each section having a different refresh interval. For example, two temperature thresholds 55° C. and 20° C. are used to divide the operating temperature into three temperature sections of: greater than 55° C., less than 55° C. and greater than 20° C., and less than 20° C. Then, the time interval of the temperature section of less than 55° C. and greater than 20° C. is adjusted to be 4 times more than of the temperature section of greater than 55° C., and the time interval of less than 20° C. is adjusted to be 16 times more than the temperature section of greater than 55° C. In this way, the refresh request signal having the different refresh interval may be provided according to the different temperature.

However, a current consumption will increase at temperature slight above the temperature threshold in the conventional technology. For instance, at temperature slightly above 55° C. where the refresh interval is not yet changed and temperature slight above 20° C. where the refresh interval is not yet changed, because the refresh intervals are not yet changed, a refresh frequency of the refresh request signals will be 4 times higher than those at temperatures 55° C. and 20° C., and lead to a greater consumption of the refresh current. Another approach is to use more temperature thresholds to divide the operating temperature into more temperature sections. However, this approach will require more counters, temperature sensing circuits and selectors to be added to the circuit. In addition to increased costs, more counters will also reduce counter bits, resulting in a lower resolution of the refresh interval.

SUMMARY

The invention provides a memory device capable of providing an average refresh interval corresponding to temperature with a high resolution without increasing clock frequency and consumed current.

The invention provides a temperature sensing circuit adapted for a memory device. The memory device includes an oscillator, a count circuit, a control circuit, a sense circuit and a select circuit. The oscillator is configured to provide an oscillation signal. The count circuit is coupled to the oscillator, configured to count the oscillation signal to generate a first count signal, and configured to generate a second count signal. The count circuit is coupled to the count circuit, and configured to perform a logic operation on the second count signal to generate an enable signal and a sensing adjustment signal. The sense circuit is coupled to the control circuit, generates a reference temperature voltage by dividing a reference voltage according to the sensing adjustment signal, and compares the reference temperature voltage and a monitor voltage according to the enable signal to generate a determination signal. The select circuit is coupled to the oscillator, the count circuit and the sense circuit. The select circuit dynamically selects one of the oscillation signal and the first count signal according to the determination signal, and generates a pulse of a refresh request signal according to the dynamically selected one of the oscillation signal and the first count signal.

The invention provides a sensing method adapted for a memory device. The memory device has a temperature sensing circuit. The temperature sensing circuit has an oscillator, a count circuit, a control circuit, a sense circuit and a select circuit. The sensing method includes: providing an oscillation signal; and counting the oscillation signal to generate a first count signal, and generating a second count signal. A logic operation is performed on the second count signal to generate an enable signal and a sensing adjustment signal. A reference temperature voltage is generated by dividing a reference voltage according to the sensing adjustment signal, and the reference temperature voltage and a monitor voltage are compared according to the enable signal to generate a determination signal. One of the oscillation signal and the first count signal is dynamically selected according to the determination signal, and a pulse of a refresh request signal is generated according to the dynamically selected one of the oscillation signal and the first count signal.

Based on the above, the temperature sensing circuit of the invention can dynamically adjust a ratio of pulses in the refresh request signal having the different refresh interval according to temperature of the memory cell to provide a high average refresh interval, and provide the high resolution of the average refresh interval with respect to temperature without increasing clock frequency and consumed current.

To make the aforementioned more comprehensible, several embodiments accompanied with drawings are described in detail as follows.

BRIEF DESCRIPTION OF THE DRAWINGS

FIG. 4 is a conversion table of a count signal CNT_N and a sensing adjustment signal ST in a control circuit illustrated according to one embodiment of the invention.

FIG. 6A is a statistical table of average interval of estimated refresh requests illustrated according to one embodiment of the invention.

FIG. 10A is a statistical table of average interval of estimated refresh requests illustrated according to another embodiment of the invention.

FIG. 11A is a statistical table of average interval of estimated refresh requests illustrated according to yet another embodiment of the invention.

DETAILED DESCRIPTION

Figure 1:
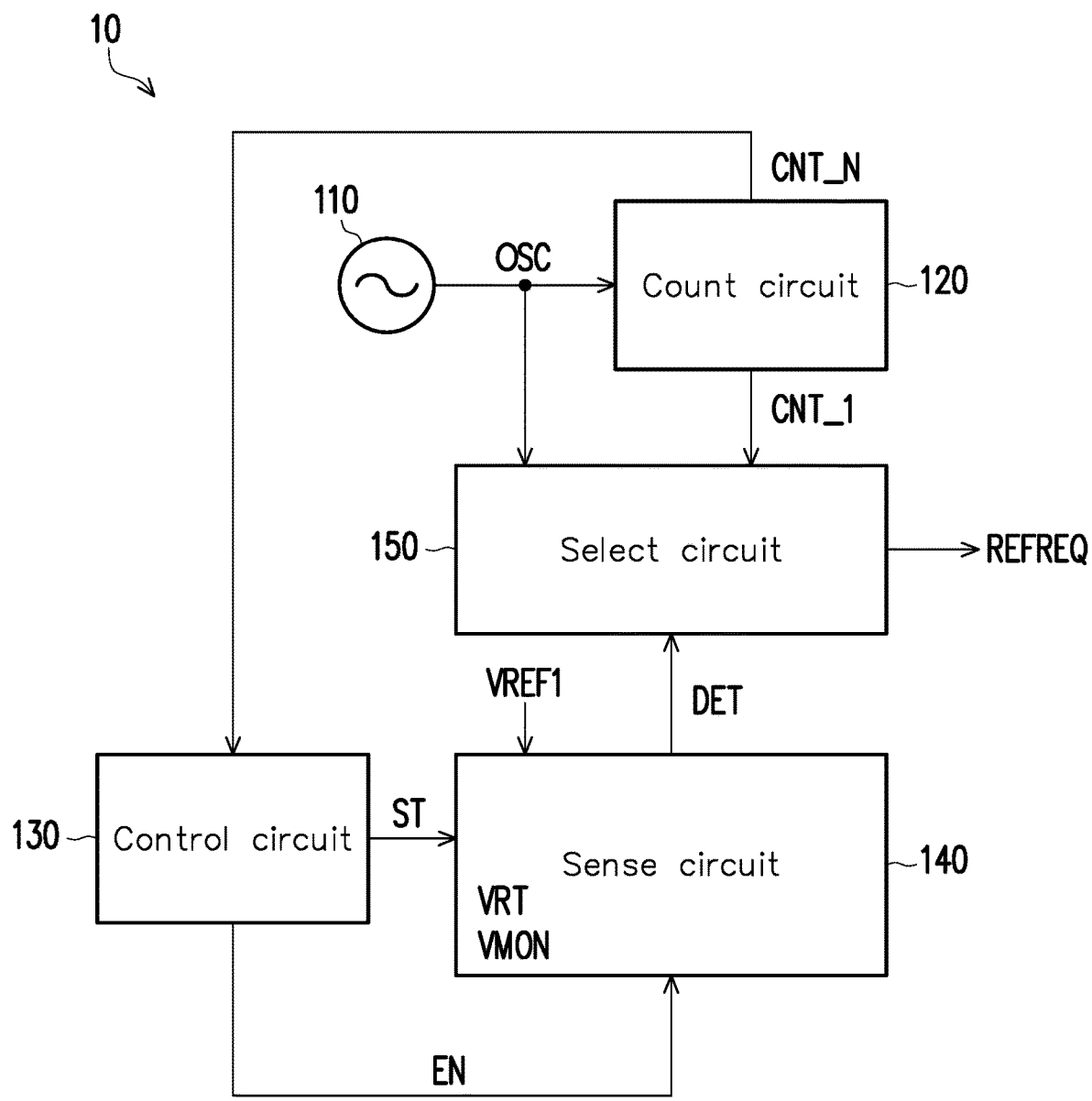
FIG. 1 is a block diagram of a temperature sensing circuit illustrated according to one embodiment of the invention.

Referring to FIG. 1, a temperature sensing circuit 10 is adapted for a memory device (not illustrated). The temperature sensing circuit 10 includes an oscillator 110, a count circuit 120, a control circuit 130, a sense circuit 140 and a select circuit 150. In this embodiment, the temperature sensing circuit 10 is configured to provide a refresh request signal REFREQ to a refresh circuit (not illustrated) in the memory device, so as to drive the refresh circuit to refresh memory cells (not illustrated) in the memory device. In the invention, the temperature sensing circuit 10 counts an oscillation signal OSC to generate a reference temperature voltage VRT for corresponding to each temperature of the memory cell, compares a monitor voltage VMON corresponding to a current temperature of the memory cell and the reference temperature voltage VRT corresponding to each temperature to dynamically adjust an average refresh interval of the reference temperature voltage REFREQ such that the reference temperature voltage REFREQ has a relatively high refresh interval, and provides a refresh interval with the high resolution for temperature without increasing a frequency of the oscillation signal OSC.

Figure 2:
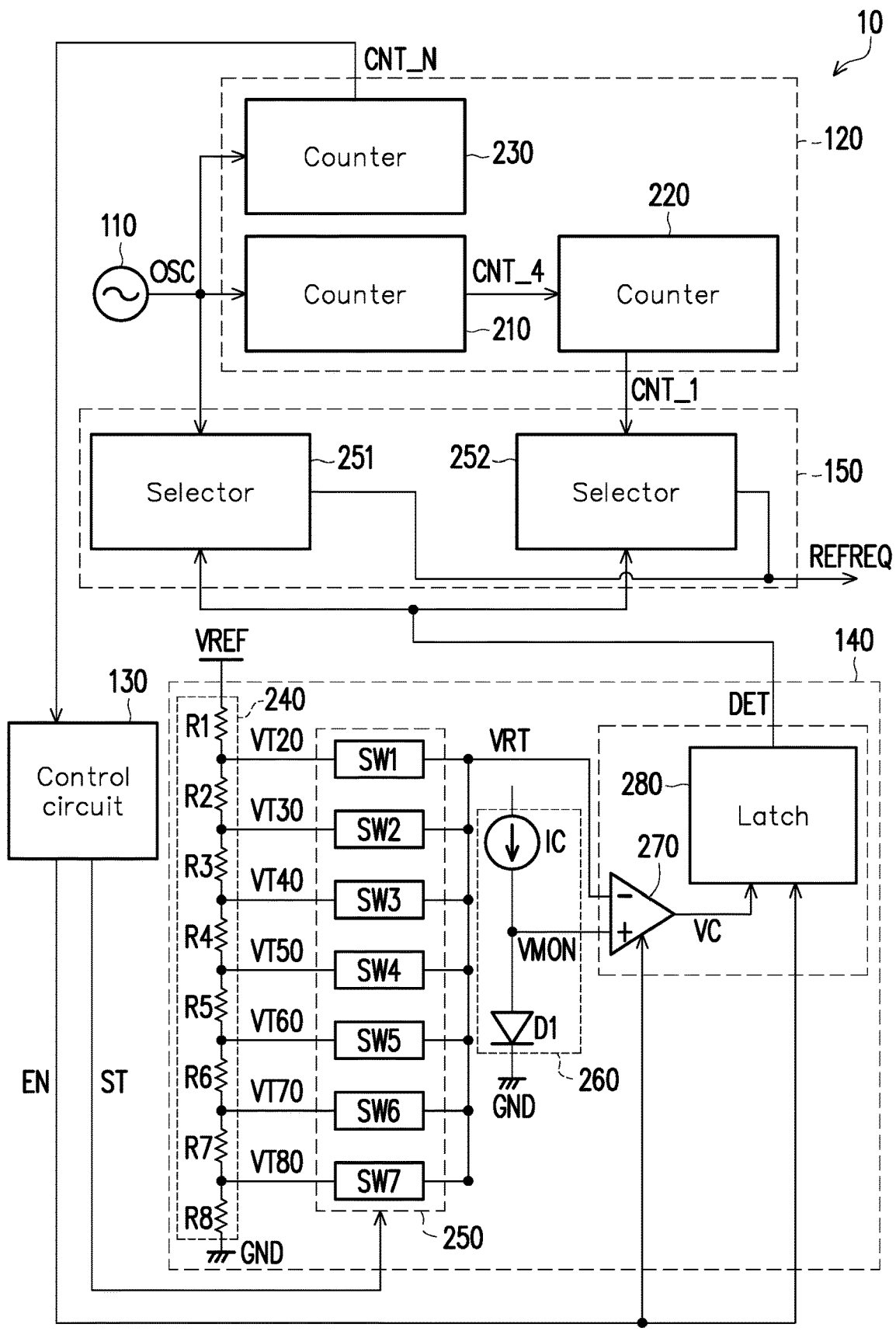
FIG. 2 is a circuit diagram of a temperature sensing circuit illustrated according to one embodiment of the invention.

Referring to FIG. 1 and FIG. 2 together, the oscillator 110 is configured to provide the oscillation signal OSC to the count circuit 120 and the select circuit 150. In one embodiment, the oscillator 110 may be a conventional voltage-controlled oscillator (VCO), and the oscillation signal OSC may be a pulse signal with a fixed frequency. However, the invention is not limited in this regard.

The count circuit 120 is coupled to the oscillator 110. The count circuit 120 receives the oscillation signal OSC, and counts the oscillation signal OSC to generate count signals CNT_1 and CNT_N. In one embodiment, the count circuit 120 may count a pulse count of the oscillation signal OSC. The count circuit 120 may be a conventional synchronous counter or other counters, but the invention is not limited thereto. Specifically, in one embodiment, the count circuit 120 includes counters 210 to 230.

The counter 210 is coupled to the oscillator 110, and configured to receive and count the pulse count of the oscillation signal OSC to generate a count signal CNT_4. In one embodiment, the counter 210 generates 1 pulse of the count signal CNT_4 for each 4 rising edges of the oscillation signal OSC counted, and thus a cycle of the count signal CNT_4 is 4 times the oscillation signal OSC. Each time 4 pulses of the oscillation signal OSC are counted by the counter 210, the count of the counter 210 is returned to 0.

The counter 220 is coupled between the counter 210 and the select circuit 150, and configured to receive and count a pulse count of the count signal CNT_4 to generate the count signal CNT_1. In one embodiment, the counter 220 generates 1 pulse of the count signal CNT_1 for each 4 rising edges of the count signal CNT_4 counted. Thus, a cycle of the count signal CNT_1 is 4 times the count signal CNT_4, and the cycle of the count signal CNT_1 is 16 times the oscillation signal OSC. And each time 4 count signals CNT_4 are counted by the counter 220, the count of the counter 210 is returned to 0.

The counter 230 is configured to receive and count the pulse count of the oscillation signal OSC to generate the count signal CNT_N. In one embodiment, the counter 230 generates 1 pulse of the count signal CNT_N for each N rising edges of the oscillation signal OSC counted, and thus a cycle of the count signal CNT_N is N times the oscillation signal OSC. Each time N oscillation signals OSC are counted by the counter 230, the count of the counter 230 is returned to 0. In one embodiment, N may be a multiple of 16, such as 16, 64 and so on.

It should be noted that, the counters 210 and 220 are configured to assist the selection circuit 150 to adjust a refresh interval of the refresh request signal REFREQ, and the counter 230 is configured to generate the selected reference temperature voltage VRT through the control circuit 130. Details regarding the above will be described later. In addition, the invention does not limit the manner in which the counters 210 to 230 count signals.

The control circuit 130 is coupled to the count circuit 120. In one embodiment, the control circuit 130 may be a central processing unit, a microprocessor, an application specific integrated circuit or other similar devices or a combination of above-mentioned devices. Here, the control circuit 130 is programmed to execute functions or steps described below. The control circuit 130 receives the count signal CNT_N, and performs a logic operation on the count signal CNT_N to generate an enable signal EN and the sensing adjustment signal ST.

In one embodiment, each time when the control circuit 130 detects that the pulse count of the oscillation signal OSC is equal to a preset number according to the count signal CNT_N, the control circuit 130 enables the enable signal EN and provides the enable signal EN to the sense circuit 140. Specifically, in one embodiment, each time when the control circuit 130 receives the pulses of the count signal CNT_N (i.e., when 16 pulses of the oscillation signal OSC are counted by the counter 230), the control circuit 130 enables the enable signal EN to be provided to the sense circuit 140 to high logic level, so as to enable the sense circuit 140.

Referring to FIG. 2 and FIG. 4, in one embodiment, the control circuit 130 performs a logic conversion on the count signal CNT_N according to one preset conversion table shown by FIG. 4, so as to generate the sensing adjustment signal ST. Here, a logic value of the sensing adjustment signal ST corresponds to a plurality of preset temperature voltages of the memory device. Specifically, referring to FIG. 4, in one embodiment, the count signal CNT_NT has 4 bits (i.e., bit0A to bit3A), and the sensing adjustment signal ST has 3 bits (i.e., bit0B to bit2B). For instance, when the control circuit CNT_N is 6 (i.e., 0010), the control circuit 130 performs the logic conversion on the count signal CNT_N according to FIG. 4 and fetches values of bit0A to bit2A of the count signal CNT_N to generate the sensing adjustment signal ST. Therefore, the sensing adjustment signal ST is 6 (i.e., 110) at this time. When the control circuit CNT_N is 7 (i.e., 0111), the control circuit 130 performs the logic conversion on the count signal CNT_N according to FIG. 4 and fetches the values of bit0A to bit2A (i.e., 111) of the count signal CNT_N to generate the sensing adjustment signal ST. However, as the logic conversion is preset to convert 111 to 000, the sensing adjustment signal ST is 0 (i.e., 000) at this time.

Figure 5:
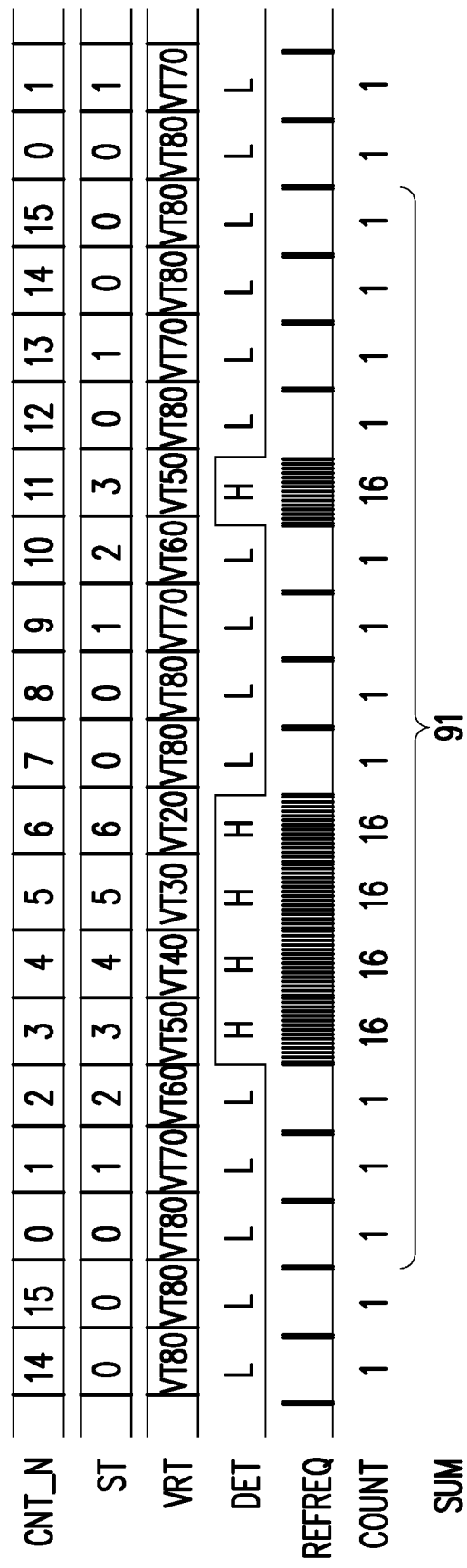
FIG. 5 is a timing diagram for generating a refresh request signal illustrated according to one embodiment of the invention.

Referring to the conversion table in FIG. 4 and a timing sequence of the count signal CNT_N and the sensing adjustment signal ST in FIG. 5, each logic value of the count signal CNT_N corresponds to the respective logic value of the sensing adjustment signal ST. In one embodiment, when the control signal CNT is 0, 1, 2, 3, 4, 5, 6, 7, 8, 9, 10, 11, 12, 13, 14 or 15, the sensing adjustment signal ST correspondingly generated after the control circuit 130 performs the logic operation is 0, 1, 2, 3, 4, 5, 6, 0, 0, 1, 2, 3, 0, 1, 0 or 0. However, the invention is not limited in this regard.

Referring to FIG. 2, the sense circuit 140 is coupled to the control circuit 130, and receives the enable signal EN, the sensing adjustment signal ST and a reference voltage VREF. The sense circuit 140 generates the reference temperature voltage VRT by dividing the reference voltage VREF according to the sensing adjustment signal ST, and the sense circuit 140 compares the reference temperature voltage VRT and the monitor voltage VMON according to the enable signal EN to generate a determination signal DET. In one embodiment, the sense circuit 140 includes a voltage division circuit 240, a switch train 250, a monitor voltage generating circuit 260, a comparator 270 and a latch 280.

Specifically, the sense circuit 140 may divide the reference voltage VREF by the voltage division circuit 240, and turn on one switch in the switch train 250 according to the sensing adjustment signal ST, so as to generate the reference temperature voltage VRT. The sense circuit 140 may generate the monitor voltage VMON by the monitor voltage generating circuit 260, enable the comparator 250 by the enable signal EN to compare the reference temperature voltage VRT and the monitor voltage VMON, and generate, according to a comparison result, a compared voltage VC to be provided to the latch 280. The sense circuit 140 latches the compared voltage VC by the latch 280 to generate the determination signal DET to be provided to the select circuit 150.

The voltage division circuit 240 has a plurality of divider resistors R1 to R8 coupled in series. The divider resistors R1 to R8 are coupled between the reference voltage VREF and a ground voltage GND, and generate a plurality of preset temperature voltages VT20 to VT80 by dividing a voltage difference between the reference voltage VREF and the ground voltage GND. Here, a voltage division between the divider resistors R1 and R2 is the preset temperature voltage VT20; a voltage division between the divider resistors R2 and R3 is the preset temperature voltage VT30; a voltage division between the divider resistors R3 and R4 is the preset temperature voltage VT40; a voltage division between the divider resistors R4 and R5 is the preset temperature voltage VT50; a voltage division between the divider resistors R5 and R6 is the preset temperature voltage VT60; a voltage division between the divider resistors R6 and R7 is the preset temperature voltage VT70; and a voltage division between the divider resistors R7 and R8 is the preset temperature voltage VT80.

The switch train 250 is coupled to the control circuit 130 and the voltage division circuit 240, and has a plurality of switches SW1 to SW7. A first end of each of the switches SW1 to SW7 separately receives one of the preset temperature voltages VT20 to VT80. In one embodiment, the first end of the switch SW1 receives the preset temperature voltage VT20; the first end of the switch SW2 receives the preset temperature voltage VT30; the first end of the switch SW3 receives the preset temperature voltage VT40; the first end of the switch SW4 receives the preset temperature voltage VT50; the first end of the switch SW5 receives the preset temperature voltage VT60; the first end of the switch SW6 receives the preset temperature voltage VT70; and the first end of the switch SW7 receives the preset temperature voltage VT80. Second ends of all the switches SW1 to SW7 are coupled to each other. The switch train 250 turns on one of the switches SW1 to SW7 according to the sensing adjustment signal ST, and provides one of the preset temperature voltages VT20 to VT80 corresponding to the turned on one of the switches SW1 to SW7 to the second ends of the switches SW1 to SW7, so as to generate the reference temperature voltage VRT. In one embodiment, when the switch SW1 is turned on, the reference temperature voltage VRT is equal to the preset temperature voltage VT20, and so on and so forth. In one embodiment, a correspondence relational expression of the logic value of the sensing adjustment signal ST and the reference temperature voltage VRT is "VRT[10*(8−i)]=ST[i], i=0-6". For instance, when i is 0, VRT[80])=ST[0]. In one embodiment, a detailed correspondence of the logic value of the sensing adjustment signal ST and the reference temperature voltage VRT is shown in Table 1 below.

TABLE 1

| ST | 0 | 1 | 2 | 3 | 4 | 5 | 6 |
|---|---|---|---|---|---|---|---|
| VRT | VT 80 | VT 70 | VT 60 | VT 50 | VT 40 | VT 30 | VT 20 |

The monitor voltage generating circuit 260 is configured to provide the monitor voltage VMON. In one embodiment, the monitor voltage generating circuit 260 includes a constant current source IC and a diode D1. The constant current source IC is configured to provide a constant current, and the diode D1 is coupled between the constant current source IC and the ground voltage GND and configured to generate the monitor current VMON according to the constant current. The invention does not limit the type of the constant current source IC.

The comparator 270 is coupled to the switch train 250 and the monitor voltage generating circuit 260, and configured to compare the reference temperature voltage VRT and the monitor voltage VMON according to the enable signal EN, so as to generate the compared voltage VC. In one embodiment, the comparator 270 has a positive input terminal, a negative input terminal, an enable terminal and an output terminal. The positive input terminal of the comparator 270 is coupled to monitor voltage generating circuit 260 to receive the monitor voltage VMON, and the negative input terminal of the comparator 270 is coupled to the switch train 250 to receive the reference temperature voltage VRT. The enable terminal of the comparator 270 is coupled to the control circuit 130, and configured to receive the enable signal EN to determine whether perform a comparing operation. When the enable signal EN is disabled (e.g., at low logic level), the comparator 270 does not compare the reference temperature voltage VRT and the monitor voltage VMON. When the enable signal EN is enabled (e.g., at high logic level), the comparator 270 compares the reference temperature voltage VRT and the monitor voltage VMON, and outputs the comparison result as the compared voltage VC. When the monitor voltage VMON is less than the reference temperature voltage VRT, the comparator 270 outputs a disabled compared voltage VC (e.g., at low logic level). When the monitor voltage VMON is greater than the reference temperature voltage VRT, the comparator 270 outputs an enabled compared voltage VC (e.g., at high logic level).

The latch 280 is coupled to the comparator 270, and configured to latch the compared voltage VC to generate the determination signal DET to be provided to the select circuit 150. In one embodiment, when the enable signal EN is disabled, the latch 280 uses a retention state as the determination signal DET to be output to the select circuit 150. When the enable signal EN is enabled, the latch 280 latches the compared voltage VC and output the updated determination signal DET to the select circuit 150.

Referring to FIG. 1 and FIG. 2, the sense circuit 150 is coupled to the oscillator 110, the count circuit 120 and the sense circuit 140. The select circuit 150 dynamically selects one signal from the oscillation signal OSC and the count signal CNT_1 according to the determination signal DET, and generates a pulse of the refresh request signal REFREQ according to the dynamically selected one of the oscillation signal OSC and the count signal CNT_1. In one embodiment, the select circuit 150 includes selectors 251 and 252. The selector 251 is coupled between the oscillator 110 and the sense circuit 140, and the selector 252 is coupled between the count circuit 120 and the sense circuit 140. Here, the selectors 251 and 252 are alternately activated according to a logic level of the determination signal DET to jointly generate the refresh request signal REFREQ, and their specific timing will be described below.

In one embodiment, the selector 251 outputs a pulse of the oscillation signal OSC and the selector 252 does not output signals when the determination signal DET is enabled, and the selector 252 outputs a pulse of the count signal CNT_1 and the selector 251 does not output signals when the determination signal DET is disabled, so as to jointly generate the refresh request signal REFREQ.

Figure 3:
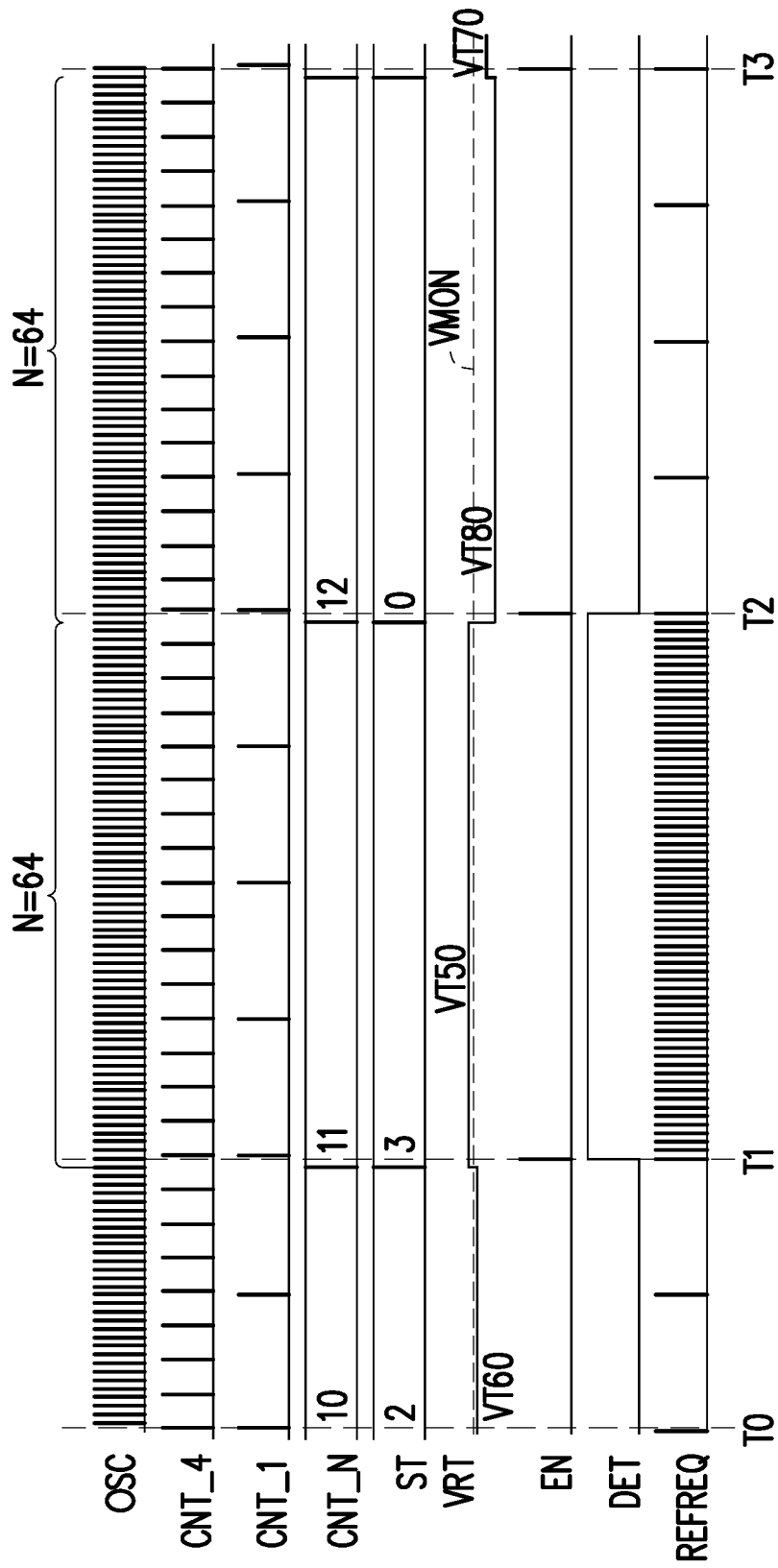
FIG. 3 is a control timing diagram of a temperature sensing circuit illustrated according to one embodiment of the invention.

FIG. 3 is a control timing diagram of a temperature sensing circuit illustrated according to one embodiment of the invention. Referring to FIG. 2 and FIG. 3, in one embodiment, the cycle of the count signal CNT_4 is 4 times the oscillation signal OSC; the cycle of the count signal CNT_1 is 4 times the count signal CNT_4; the cycle of the count signal CNT_N is 4 times the count signal CNT_1. Therefore, in one embodiment, the cycle of the count signal CNT_N is 64 times the oscillation signal OSC. The control circuit 130 performs the logic conversion on the count signal CNT_N according to the conversion table of FIG. 4 to generate the sensing adjustment signal ST. The switch train 250 in the sense circuit 140 turns on one of the switches SW1 to SW7 according to the sensing adjustment signal ST to receive the corresponding one of the preset temperature voltages VT20 to VT80, and accordingly generates the reference temperature voltage VRT. Taking FIG. 3 as an example with the timing from left to right, values of the reference temperature voltage VRT are sequentially equal to the preset temperature voltages VT60, VT50, VT80 and VT70. The monitor voltage generating circuit 260 in the sense circuit 140 generates the monitor voltage VMON. In this embodiment, the monitor voltage VMON is equivalent to a preset temperature voltage VT55 (not illustrated) between the preset temperature voltages VT60 and VT50.

Between time T0 and time T1, the enable signal EN is disabled, and the comparator 270 does not compare the reference temperature voltage VRT and the monitor voltage VMON. At this time, the determination signal DET is disabled (e.g., at low logic level).

At time T1, the enable signal EN is enabled, the comparator 270 compares the reference temperature voltage VRT and the monitor voltage VMON. Since the reference temperature voltage VRT at the time (which is equivalent to VT50 at the time) is greater than the monitor voltage VMON, the comparator 270 generates the enabled compared voltage VC (not illustrated). Further, because the enable signal EN is enabled, the latch 280 generates the enabled determination signal DET (e.g., at high logic level).

Next, between time T1 and time T2, since the enable signal EN is disabled, the comparator 270 does not compare the reference temperature voltage VRT and the monitor voltage VMON. At this time, the latch 280 latches the compared voltage VC previously enabled such that the latch 280 holds the logic level of the enabled determination signal DET.

At time T2, the enable signal EN is enabled, the comparator 270 compares the reference temperature voltage VRT and the monitor voltage VMON. Since the reference temperature voltage VRT at the time (which is equivalent to VT80 at the time) is less than the monitor voltage VMON, the comparator 270 generates the disabled compared voltage VC (not illustrated). Further, because the enable signal EN is enabled, the latch 280 generates the disabled determination signal DET.

Next, between time T2 and time T3, since the enable signal EN is disabled, the comparator 270 does not compare the reference temperature voltage VRT and the monitor voltage VMON. At this time, the latch 280 latches the compared voltage VC previously disabled such that the latch 280 holds the logic level of the disabled determination signal DET.

Referring to FIG. 2 and FIG. 3, the select circuit 150 dynamically selects one of the oscillation signal OSC and the count signal CNT_1 according to the determination signal DET, and generates the refresh request signal REFREQ according to the dynamically selected one of the oscillation signal OSC and the count signal CNT_1. For instance, between time T0 and time T1, because the determination signal DET is disabled, the selector 252 outputs the pulse of the count signal CNT_1 and the selector 251 does not output signals in the select circuit 150. Between time T1 and time T2, because the determination signal DET is enabled, the selector 251 outputs the pulse of the oscillation signal OSC and the selector 252 does not output signals in the select circuit 150. Between time T2 and time T3, because the determination signal DET is disabled, the selector 252 outputs the pulse of the count signal CNT_1 and the selector 251 does not output signals in the select circuit 150.

FIG. 5 is a timing diagram for generating a refresh request signal illustrated according to one embodiment of the invention. FIG. 6A is a statistical table of average interval of estimated refresh requests illustrated according to one embodiment of the invention. Referring to FIG. 2, FIG. 4, FIG. 5 and FIG. 6A, in one embodiment, the control circuit 130 performs the logic conversion on the count signal CNT_N according to the conversion table of FIG. 4 to generate the sensing adjustment signal ST (referring to the count signal CNT_N and the sensing adjustment signal ST in FIG. 5). The switch train 250 in the sense circuit 140 turns on one of the switches SW1 to SW7 according to the sensing adjustment signal ST to receive the one of the preset temperature voltages VT20 to VT80, and accordingly generates the reference temperature voltage VRT (referring to the sensing adjustment signal ST and the reference temperature voltage VRT in FIG. 5). In the case where the monitor voltage VMON is between the preset temperature voltages VT50 and VT60 (e.g., VT55), the sense circuit 140 enables the determination signal DET (i.e., at high logic level H) when the reference temperature voltage VRT is between the preset temperature voltages VT20 and VT50; the sense circuit 140 disables the determination signal DET (i.e., at low logic level L) when the reference temperature voltage VRT is between the preset temperature voltages VT60 and VT80. When the determination signal DET is disabled, the selector 252 outputs the pulse of the count signal CNT_1 and the selector 251 does not output signals in the select circuit 150; when the determination signal DET is enabled, the selector 251 outputs the pulse of the oscillation signal OSC and the selector 252 does not output signals in the select circuit 150. Here, the selectors 251 and 252 are alternately activated according to the logic level of the determination signal DET to jointly generate the refresh request signal REFREQ (referring to the determination signal DET and the refresh request signal REFREQ in FIG. 5). In one embodiment, a refreshed pulse count COUNT of the refresh request signal REFREQ in each time period is as shown by FIG. 5. A refreshed pulse sum SUM of the refresh request signal REFREQ in the entire cycle (i.e., the logic values 0 to 15 of the count signal CNT_N) is 91 (referring to the refreshed pulse sum 91 corresponding to temperature 55° C. in FIG. 6A). In another scenario, when the monitor voltage VMON is between the preset temperature voltages VT60 and VT70 (e.g., VT65), the determination signal corresponding to the reference temperature voltage VRT being the preset temperature voltage VT60 changes to high logic level H. Therefore, the refreshed pulse sum SUM correspondingly changes to 121 (referring to the refreshed pulse sum 121 corresponding to temperature 65° C. in FIG. 6A).

Referring FIG. 6A, taking the memory at temperature 55° C. for example, a refreshed pulse count [1] (i.e., the number of the refreshed pulse count COUNT of the refresh request signal REFREQ having 1 pulse in one single period of the entire cycle) is 11; a refreshed pulse count [16] (i.e., the number of the refreshed pulse count COUNT of the refresh request signal REFREQ having 16 pulses in one single period of the entire cycle) is 5; the refreshed pulse sum SUM is 91; an average refreshed pulse number is 5.69 (i.e., the refreshed pulse sum SUM divided by 16); and the average fresh interval is 2.81 (i.e., 16 divided by the average refreshed pulse number). Aforementioned values for other temperatures may be deduced by analogy, and description regarding the same is not repeated hereinafter. As can be known from FIG. 6A, when the memory has a different temperature, the temperature sensing circuit 10 may provide the refresh request signal REFREQ having a different average refresh interval.

Figure 6B:
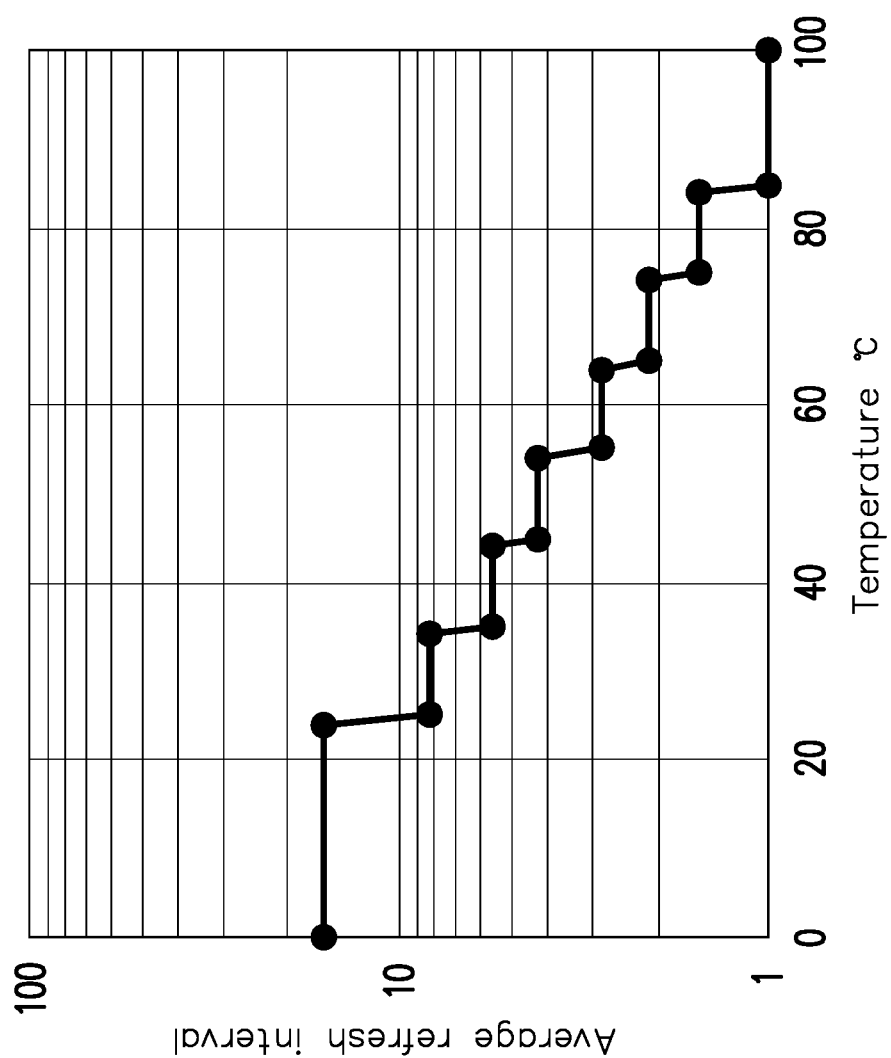
FIG. 6B is an X-Y diagram of average interval versus temperature of estimated refresh requests illustrated according to one embodiment of the invention.

FIG. 6B is an X-Y diagram of average interval versus temperature of estimated refresh requests illustrated according to one embodiment of the invention. Referring to FIGS. 6A and 6B, the temperature sensing circuit 10 provides the different average refresh interval for each 10° C. from temperatures 20° C. to 80° C. so as to achieve the high resolution of the refresh interval. In other words, the temperature sensing circuit 10 may dynamically adjust a ratio of the refreshed pulse count [1] and the refreshed pulse count [16] in the entire cycle according to temperature of the memory to adjust the average refresh interval, thereby improving the resolution of the average refresh interval with respect to temperature. Since there is no need to add more select circuits, counters and temperature sensors (not illustrated) for such a multi-temperature stepwise control, current consumption may be further reduced.

Figure 7:
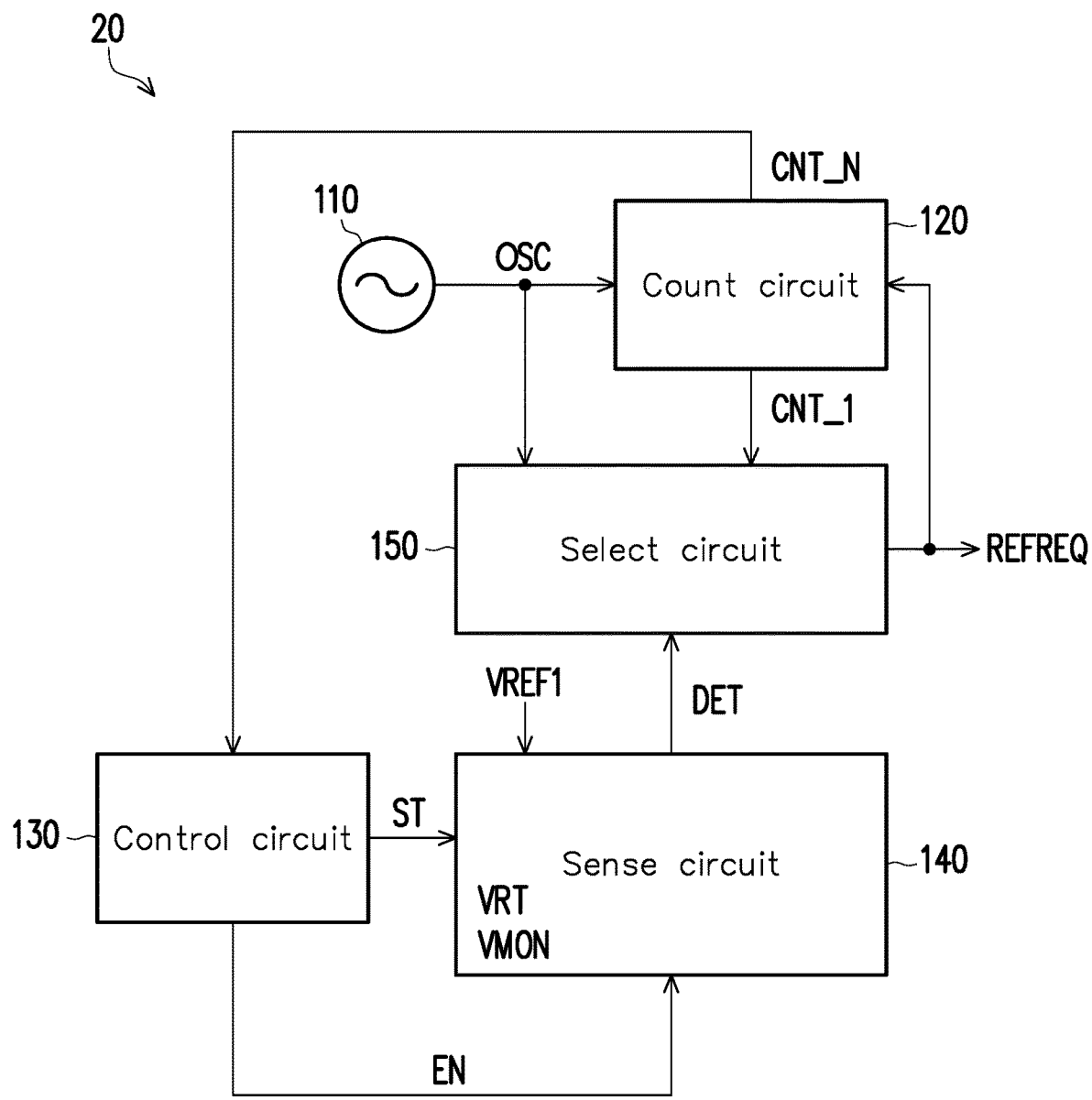
FIG. 7 is a block diagram of a temperature sensing circuit illustrated according to another embodiment of the invention.

FIG. 7 is a block diagram of a temperature sensing circuit illustrated according to another embodiment of the invention. FIG. 7 is substantially the same as FIG. 1 and will not be described again. FIG. 7 is different from FIG. 1 in that the count circuit 120 in a temperature sensing circuit 20 in FIG. 7 further receives the refresh request signal REFREQ and generates the count signal CNT_N according to the refresh request signal REFREQ.

Figure 8:
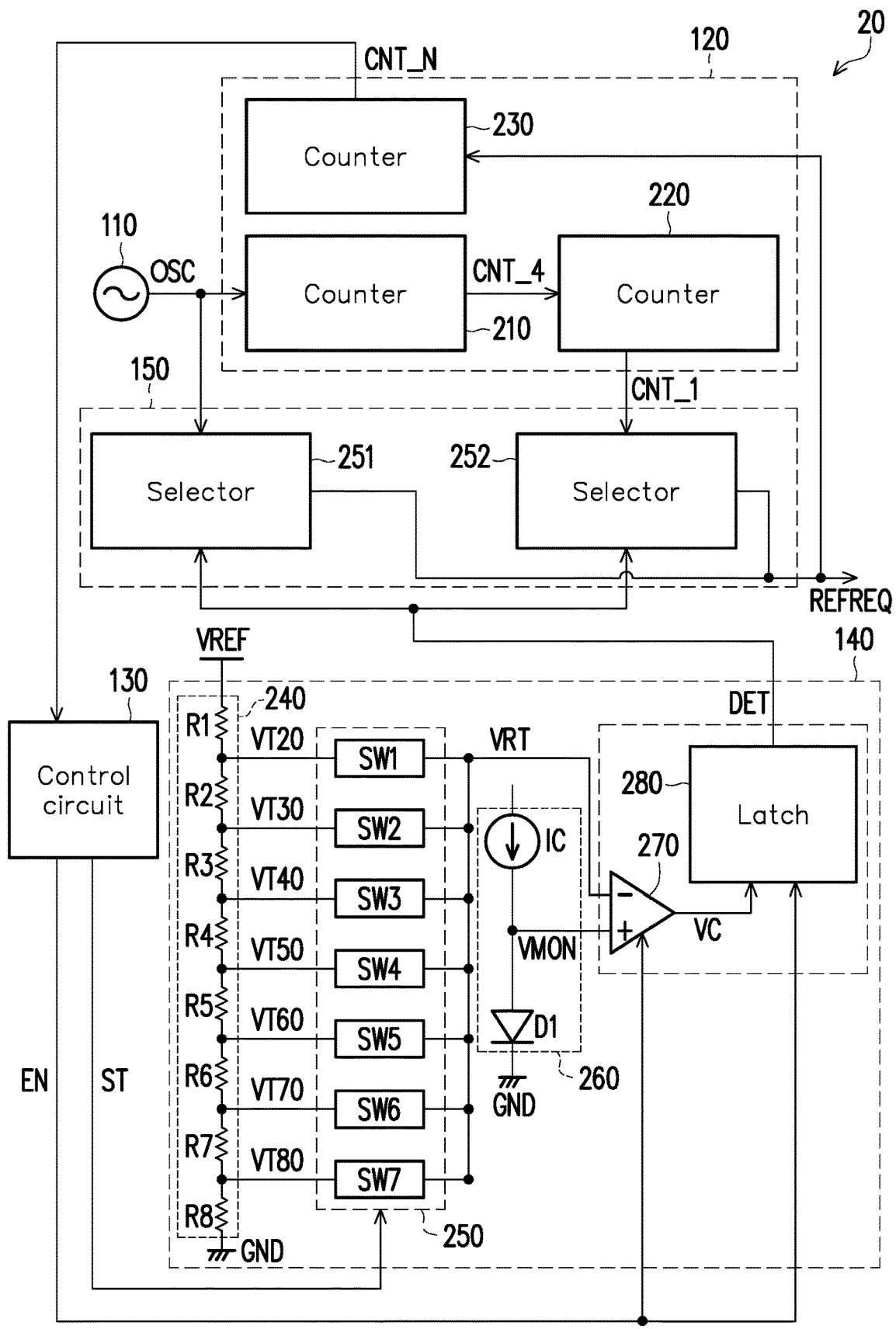
FIG. 8 is a circuit diagram of a temperature sensing circuit illustrated according to another embodiment of the invention.

FIG. 8 is a circuit diagram of a temperature sensing circuit illustrated according to another embodiment of the invention. FIG. 8 is substantially the same as FIG. 2 and will not be described again. FIG. 8 is different from FIG. 2 in that the counter 230 in a temperature sensing circuit 20 in FIG. 8 is configured to receive and count the pulse count of the refresh request signal REFREQ to generate the count signal CNT_N. In another embodiment, the counter 230 generates 1 pulse of the count signal CNT_N for each 1 rising edge of the refresh request signal REFREQ counted, and thus the cycle of the count signal CNT_N is 1 times the refresh request signal REFREQ.

Figure 9:
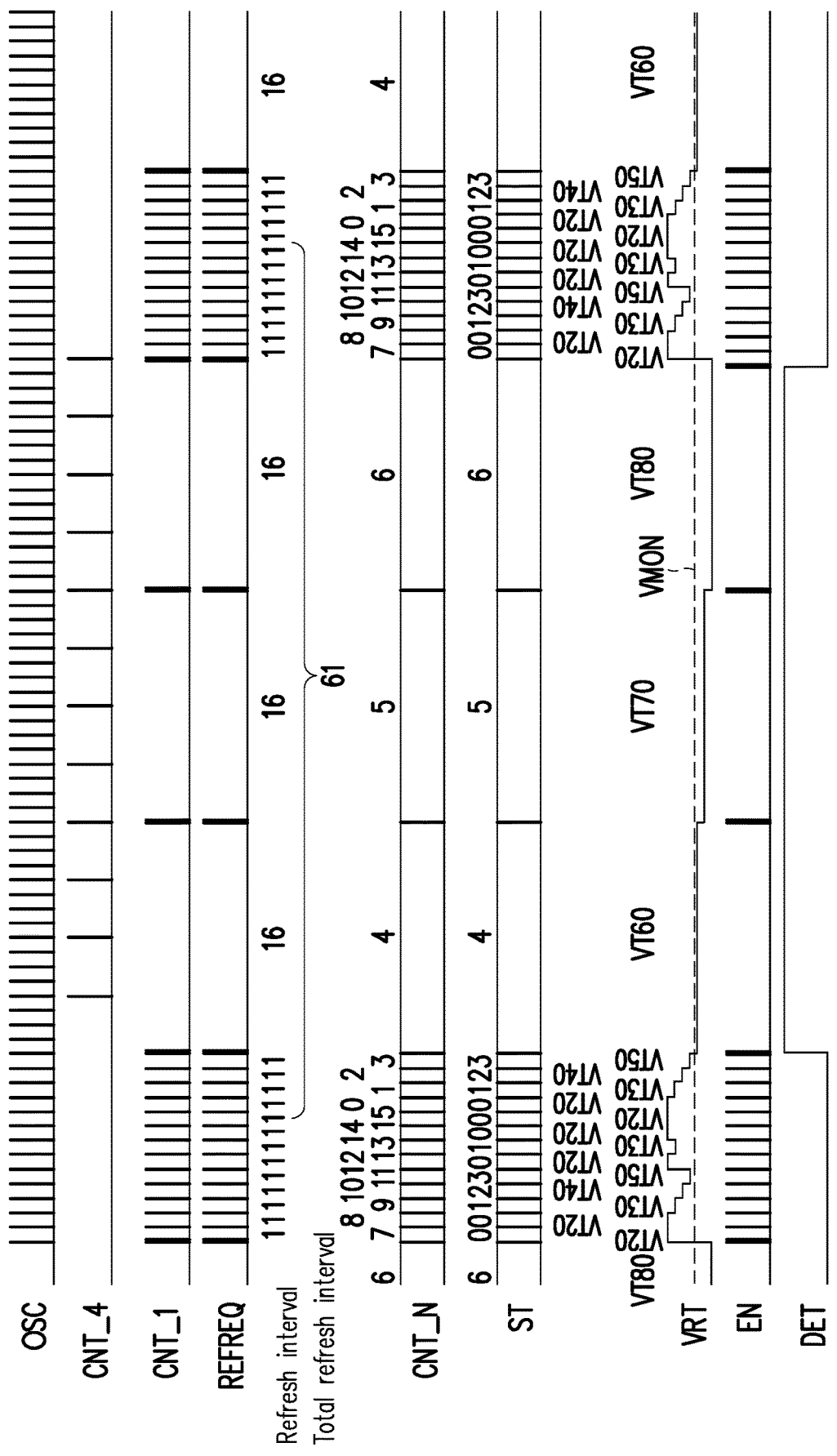
FIG. 9 is a timing diagram of a temperature sensing circuit illustrated according to another embodiment of the invention.

FIG. 9 is a timing diagram of a temperature sensing circuit illustrated according to another embodiment of the invention. Referring to FIG. 9, in one embodiment, the counter 230 in a temperature sensing circuit 20 in FIG. 8 is configured to receive and count the pulse count of the refresh request signal REFREQ to generate the count signal CNT_N. The control circuit 130 in the temperature sensing circuit 20 performs the logic conversion on the count signal CNT_N according to the conversion table of FIG. 4 to generate the sensing adjustment signal ST and generate the enable signal EN (referring to the count signal CNT_N and the sensing adjustment signal ST in FIG. 9). The switch train 250 in the sense circuit 140 in the temperature sensing circuit 20 turns on one of the switches SW1 to SW7 according to the sensing adjustment signal ST to receive the one of the preset temperature voltages VT20 to VT80, and generates the reference temperature voltage VRT (referring to the sensing adjustment signal ST and the reference temperature voltage VRT in FIG. 9). In the case where the monitor voltage VMON is between the preset temperature voltage VT50 and VT60 (e.g., VT55), the sense circuit 140 disables the determination signal DET when the reference temperature voltage VRT is between the preset temperature voltages VT20 and VT50; the sense circuit 140 enables the determination signal DET when the reference temperature voltage VRT is between the preset temperature voltages VT60 and VT80. When the determination signal DET is enabled, the selector 252 outputs the pulse of the count signal CNT_1 and the selector 251 does not output signals in the select circuit 150; when the determination signal DET is disabled, the selector 251 outputs the pulse of the oscillation signal OSC and the selector 252 does not output signals in the select circuit 150. Here, the selectors 251 and 252 are alternately activated according to the logic level of the determination signal DET to jointly generate the refresh request signal REFREQ (referring to the determination signal DET and the refresh request signal REFREQ in FIG. 9). In another embodiment, the refresh interval of the refresh request signal REFREQ in each time period is as shown by FIG. 9, and a total refresh interval of the refresh request signal REFREQ in the entire cycle (i.e., the logic values 0 to 15 of the count signal CNT_N) is 61.

FIG. 10A is a statistical table of average interval of estimated refresh requests illustrated according to another embodiment of the invention. Referring to FIG. 10A, with temperature of the memory being 55° C. for example, the average refreshed pulse number [16] is 3; the refreshed pulse count [1] is 13; and the average refresh interval is 3.81. Aforementioned values for other temperatures may be deduced by analogy, and description regarding the same is not repeated hereinafter. As can be known from FIG. 10A, in another embodiment, for the memory having a different temperature, the temperature sensing circuit 20 may provide the refresh request signal REFREQ having a different average refresh interval.

Figure 10B:
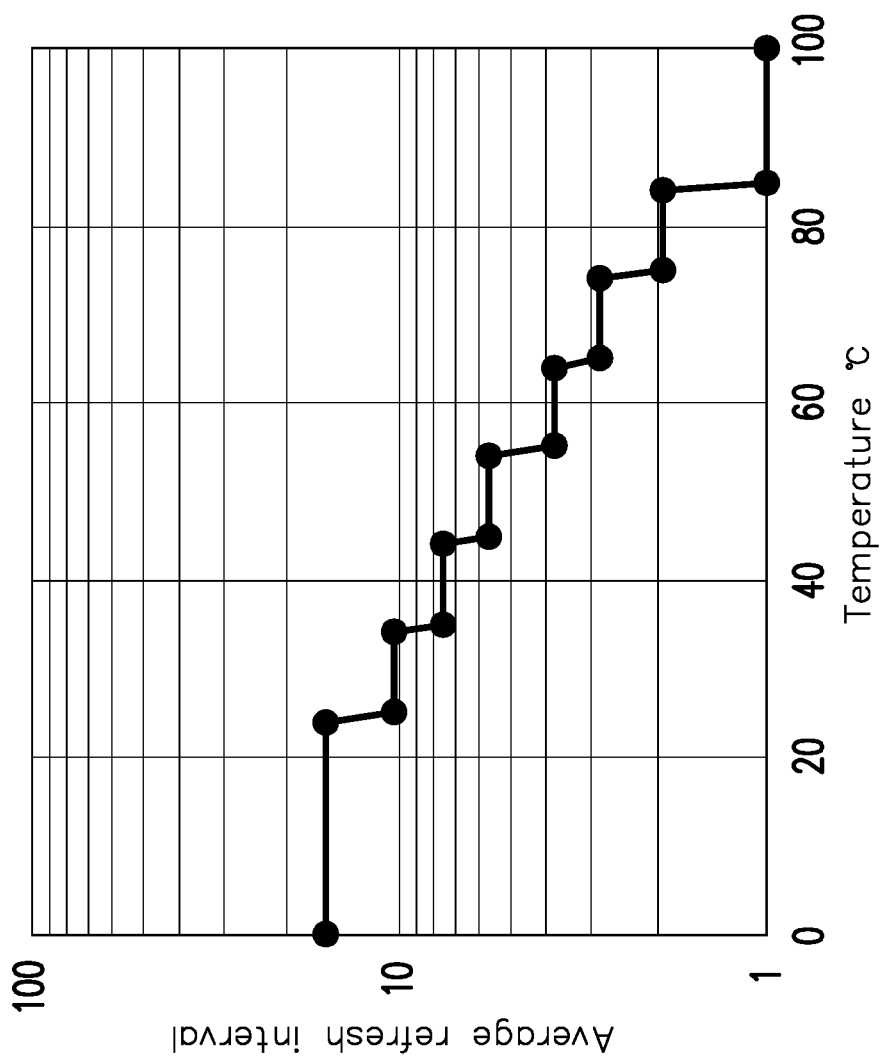
FIG. 10B is an X-Y diagram of average interval versus temperature of estimated refresh requests illustrated according to another embodiment of the invention.

FIG. 10B is an X-Y diagram of average interval versus temperature of estimated refresh requests illustrated according to another embodiment of the invention. Referring to FIGS. 10A and 10B, the temperature sensing circuit 20 provides the different average refresh interval for each 10° C. from temperatures 20° C. to 80° C. so as to achieve the high resolution of the refresh interval. In other words, the temperature sensing circuit 20 may dynamically adjust a ratio of the refreshed pulse count[16] and the refreshed pulse count [1] in the entire cycle according to temperature of the memory to adjust the average refresh interval, thereby improving the resolution of the average refresh interval with respect to temperature. Since there is no need to add more select circuits, counters and temperature sensors (not illustrated) for such a multi-temperature stepwise control, current consumption may be further reduced.

Figure 11B:
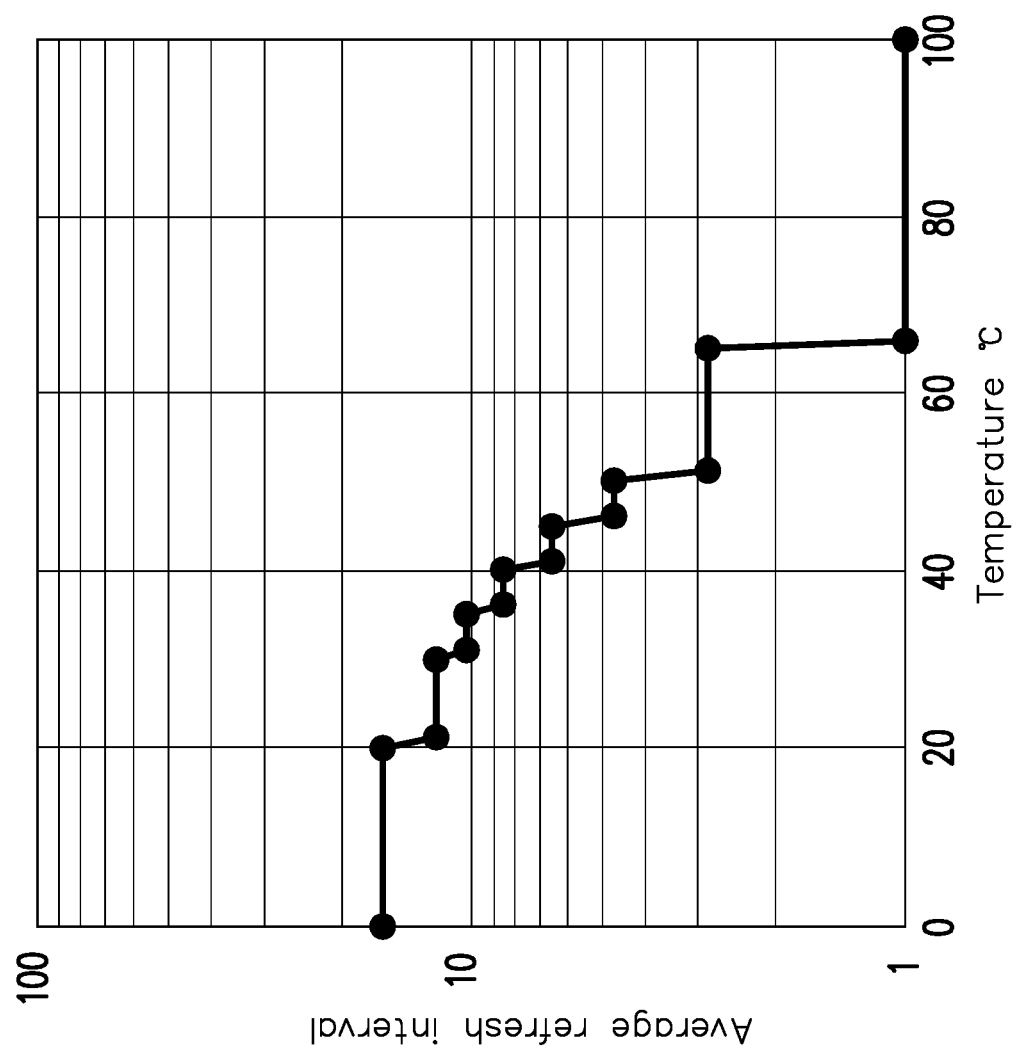
FIG. 11B is an X-Y diagram of average interval versus temperature of estimated refresh requests illustrated according to yet another embodiment of the invention.
Figure 12:
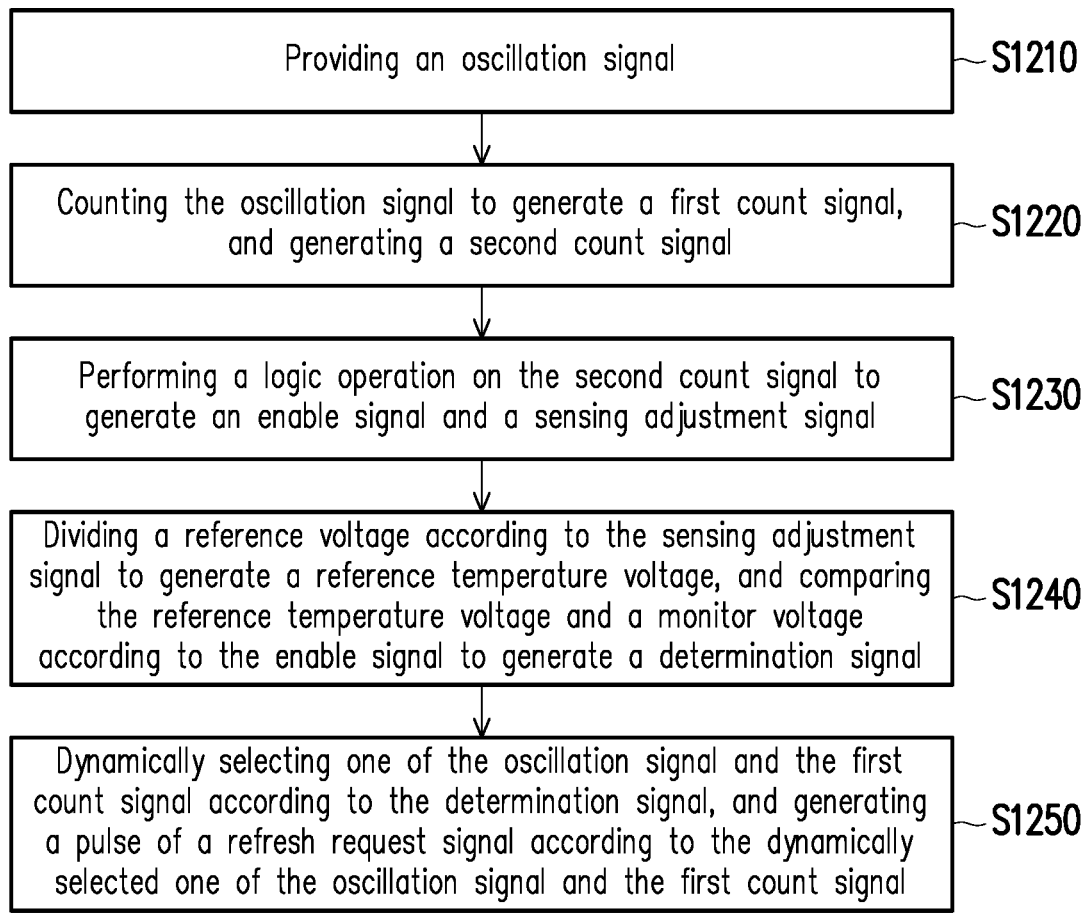
FIG. 12 is a flowchart of an operating method of a temperature sensing circuit illustrated according to one embodiment of the invention.

FIG. 11A is a statistical table of average interval of estimated refresh requests illustrated according to yet another embodiment of the invention. FIG. 11B is an X-Y diagram of average interval versus temperature of estimated refresh requests illustrated according to yet another embodiment of the invention. Referring to FIG. 11A and FIG. 11B, which are different from FIG. 6A, FIG. 6B, FIG. 10A and FIG. 10B in that steps between preset temperatures of the temperature sensing circuit 10 or the temperature sensing circuit 20 are adjustable (the steps are not limited to be fixed at 10° C.). In yet another embodiment, for example, a smaller step such as 5° C. may be used at temperature near room temperature so a higher resolution of the average refresh interval with respect to temperature can be obtained near room temperature. For example, as shown by FIG. 11A and FIG. 11B, in yet another embodiment, the steps between temperatures 30° C. to 50° C. are only 5° C., whereas the steps outside of temperatures 30° C. to 50° C. are greater than 5° C. Obviously, the resolution of the average update interval with respect to temperature between temperatures 30° C. to 50° C. has been improved. That is to say, steps between the preset temperature voltages VT20 between VT20 and VT80 of the temperature sensing circuit 10 or the temperature sensing circuit 20 may be further adjusted in the invention such that the average refresh interval of the refresh request signal REFREQ has a different resolution under a different temperature. In other words, since the resolution may be non-uniform, the invention can change the resolution of a specific temperature interval without changing the number of circuit components FIG. 12 is a flowchart of an operating method of a temperature sensing circuit illustrated according to one embodiment of the invention. Referring to FIG. 12, in step S1210, the oscillator 110 provides the oscillation signal OSC. In step S1220, the count circuit 120 counts the oscillation signal OSC to generate the count signal CNT_1, and the count circuit 120 generates the count signal CNT_N. Next, in step S1230, the control circuit 130 performs the logic operation on the count signal CNT_N, so as to generate the enable signal EN and the sensing adjustment signal ST. In step S1240, the sense circuit 140 generates the reference temperature voltage VRT by dividing the reference voltage VREF according to the sensing adjustment signal ST, compares the reference temperature voltage VRT and the monitor voltage VMON according to the logic level of the enable signal EN, and generates the determination signal DET according to the comparison result. In step S1250, the select circuit 150 dynamically selects one of the oscillation signal OSC and the count signal CNT_1 according to the determination signal DET, and generates the pulse of the refresh request signal REFREQ according to the dynamically selected one of the oscillation signal OSC and the count signal CNT_1.

In summary, the temperature sensing circuit and the sensing method of the invention can dynamically adjust the average update interval of the refresh request signal to improve the resolution of the average update interval with respect to temperature. In the invention, the oscillation signal and the count signal are dynamically adjusted to adjust a ratio of the refreshed pulse in the entire period for the different refresh interval. Accordingly, the average refresh interval may be adjusted to thereby improve the resolution of the average refresh interval with respect to temperature. Since there is no need to add and use more select circuits, counters and temperature sensors (not illustrated) for a multi-temperature stepwise control, current consumption may be further reduced without increase the frequency of the oscillation signal. Moreover, according to one embodiment of the invention, the invention may also make a non-uniform configuration for the resolution of the average update interval with respect to temperature, thereby improving the resolution of a target temperature region.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A temperature sensing circuit adapted for a memory device, comprising:
   an oscillator, configured to provide an oscillation signal;
   a count circuit, coupled to the oscillator, configured to count the oscillation signal to generate a first count signal, and configured to generate a second count signal;
   a control circuit, coupled to the count circuit, and configured to perform a logic operation on the second count signal to generate an enable signal and a sensing adjustment signal;
   a sense circuit, coupled to the control circuit, generating a reference temperature voltage by dividing a reference voltage according to the sensing adjustment signal, and comparing the reference temperature voltage and a monitor voltage according to the enable signal to generate a determination signal; and a select circuit, coupled to the oscillator, the count circuit and the sense circuit, the select circuit dynamically selecting one of the oscillation signal and the first count signal according to the determination signal, and generating a pulse of a refresh request signal according to the dynamically selected one of the oscillation signal and the frst count signal.

2. The temperature sensing circuit according to claim 1, wherein the count circuit comprises:
   a first counter, coupled to the oscillator, and configured to receive the oscillation signal and count a pulse count of the oscillation signal to generate a third count signal;
   a second counter, coupled between the first counter and the select circuit, and configured to receive the third count signal and count a pulse count of the third count signal to generate the first count signal; and
   a third counter, configured to receive the oscillation signal and count the pulse count of the oscillation signal to generate the second count signal.

3. The temperature sensing circuit according to claim 1, wherein each time when the control circuit detects that the pulse count of the oscillation signal is equal to a first preset number according to the second count signal, the control circuit enables the enable signal.

4. The temperature sensing circuit according to claim 1, wherein the control circuit performs a logic conversion on the second count signal according to a preset conversion table to generate the sensing adjustment signal, wherein a logic value of the sensing adjustment signal corresponds to a plurality of preset temperature voltages of the memory device.

5. The temperature sensing circuit according to claim 4, wherein steps between the preset temperature voltages are adjusted such that an average refresh interval of the refresh request signal have a different resolution under a different temperature.

6. The temperature sensing circuit according to claim 1, wherein the sense circuit comprises:
   a voltage division circuit, having a plurality of divider resistors coupled in series, the divider resistors coupled in series being coupled to the reference voltage and generating a plurality of preset temperature voltages by dividing the reference voltage;
   a switch train, coupled to the control circuit and the voltage division circuit, and having a plurality of switches, a first end of each of the switches separately receiving one of the preset temperature voltages, second ends of all the switches being coupled to each other, the switch train turning on one of the switches according to sensing adjustment signal to generate the reference temperature voltage;
   a monitor voltage generating circuit, configured to provide the monitor voltage;
   a comparator, coupled to the switch train and the monitor voltage generating circuit, and configured to determine, according to the enable signal, whether to compare the reference temperature voltage and the monitor voltage to generate a compared voltage; and
   a latch, coupled to the comparator, and configured to determine, according to the enable signal, whether to latch the compared voltage to generate the determination signal.

7. The temperature sensing circuit according to claim 6, wherein the monitor voltage generating circuit comprises:

a constant current source, configured to provide a constant current; and a diode, coupled to the constant current source, and configured to generate the monitor voltage according to the constant current.

8. The temperature sensing circuit according to claim 1, wherein the select circuit comprises:
   a first selector, coupled between the oscillator and the sense circuit; and
   a second selector, coupled between the count circuit and the sense circuit,
   wherein the first selector and the second selector are alternately activated according to a logic level of the determination signal to jointly generate the refresh request signal.

9. The temperature sensing circuit according to claim 8, wherein the first selector outputs a pulse of the oscillation signal and the second selector does not output signals when the determination signal is enabled, and the second selector outputs a pulse of the first count signal and the first selector does not output signals when the determination signal is disabled, so as to jointly generate the refresh request signal.

10. The temperature sensing circuit according to claim 1, wherein the count circuit comprises:
    a first counter, coupled to the oscillator, and configured to receive the oscillation signal and count a pulse count of the oscillation signal to generate a third count signal;
    a second counter, coupled between the first counter and the select circuit, and configured to receive the third count signal and count a pulse count of the third count signal to generate the first count signal; and
    a third counter, configured to receive the refresh request signal and count a pulse count of the refresh request signal to generate the second count signal.

11. A sensing method adapted for a memory device, the memory device having a temperature sensing circuit, the temperature sensing circuit having an oscillator, a count circuit, a control circuit, a sense circuit and a select circuit, the sensing method comprising:
    providing an oscillation signal;
    counting the oscillation signal to generate a first count signal, and generating a second count signal;
    performing a logic operation on the second count signal to generate an enable signal and a sensing adjustment signal;
    generating a reference temperature voltage by dividing a reference voltage according to the sensing adjustment signal, and comparing the reference temperature voltage and a monitor voltage according to the enable signal to generate a determination signal; and
    dynamically selecting one of the oscillation signal and the first count signal according to the determination signal, and generating a pulse of a refresh request signal according to the dynamically selected one of the oscillation signal and the first count signal.

12. The sensing method according to claim 11, wherein the step of counting the oscillation signal to generate the first count signal, and generating the second count signal comprises:
    receiving the oscillation signal and counting a pulse count of the oscillation signal to generate a third count signal;
    receiving the third count signal and counting a pulse count of the third count signal to generate the first count signal; and
    receiving the oscillation signal and counting the pulse count of the oscillation signal to generate the second count signal.

13. The sensing method according to claim 11, wherein each time when the control circuit detects that the pulse count of the oscillation signal is equal to a first preset number according to the second count signal, the control circuit enables the enable signal.

14. The sensing method according to claim 11, wherein the control circuit performs a logic conversion on the second count signal according to a preset conversion table to generate the sensing adjustment signal, wherein a logic value of the sensing adjustment signal corresponds to a plurality of preset temperature voltages of the memory device.

15. The sensing method according to claim 14, wherein steps between the preset temperature voltages are adjusted such that an average refresh interval of the refresh request signal have a different resolution under a different temperature.

16. The sensing method according to claim 11, wherein the step of generating the reference temperature voltage according to the sensing adjustment signal, and comparing the reference temperature voltage and the monitor voltage according to the enable signal to generate the determination signal comprises:
  turning on one of a plurality of switches in the sense circuit according to the sensing adjustment signal, and generating the reference temperature voltage by dividing the reference voltage;
  providing the monitor voltage;
  determining, according to the enable signal, whether to compare the reference temperature voltage and the monitor voltage to generate a compared voltage; and
  latching the compared voltage to generate the determination signal.

17. The sensing method according to claim 11, wherein the step of providing the monitor voltage comprises:
  providing a constant current; and
  generating the monitor voltage according to the constant current.

18. The sensing method according to claim 11, wherein the select circuit comprises a first selector and a second selector, and the first selector and the second selector are alternately activated according to a logic level of the determination signal to jointly generate the refresh request signal.

19. The sensing method according to claim 18, wherein the first selector outputs a pulse of the oscillation signal and the second selector does not output signals when the determination signal is enabled, and the second selector outputs a pulse of the first count signal and the first selector does not output signals when the determination signal is disabled, so as to jointly generate the refresh request signal.

20. The sensing method according to claim 11, wherein the count circuit comprises:
  receiving the oscillation signal and counting a pulse count of the oscillation signal to generate a third count signal;
  receiving the third count signal and counting a pulse count of the third count signal to generate the first count signal; and
  receiving the refresh request signal and count a pulse count of the refresh request signal to generate the second count signal.

* * * * *